(12) United States Patent
Huang et al.

(10) Patent No.: US 6,191,484 B1
(45) Date of Patent: *Feb. 20, 2001

(54) METHOD OF FORMING PLANARIZED MULTILEVEL METALLIZATION IN AN INTEGRATED CIRCUIT

(75) Inventors: Kuei-Wu Huang, Irving; Tsiu C. Chan, Carrollton, both of TX (US); Jamin Ling, Westboro, MA (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/508,973

(22) Filed: Jul. 28, 1995

(51) Int. Cl.$^7$ ................................................ H01L 29/40
(52) U.S. Cl. .................... 257/752; 257/753; 257/758; 257/763
(58) Field of Search .................... 257/752, 758, 257/753, 769, 765, 763, 750, 764, 767, 770, 771, 774; 156/628, 659, 656

(56) References Cited

U.S. PATENT DOCUMENTS

| | | | |
|---|---|---|---|
| 4,631,564 | 12/1986 | Neilson et al. | 357/23.4 |
| 4,670,091 | 6/1987 | Thomas et al. | 156/643 |
| 4,702,792 | 10/1987 | Chow et al. | 156/643 |
| 4,829,024 | 5/1989 | Klein et al. | 437/189 |
| 4,914,056 | 4/1990 | Okumura | 437/192 |
| 4,926,237 | * 5/1990 | Sun et al. | 257/765 |
| 4,954,142 | 9/1990 | Carr et al. | 51/309 |
| 4,962,414 | 10/1990 | Liou et al. | 357/71 |
| 5,060,035 | 10/1991 | Nishimura et al. | 357/23.7 |
| 5,065,273 | 11/1991 | Rajeevakumar | 361/313 |
| 5,070,391 | 12/1991 | Liou et al. | 357/71 |
| 5,312,512 | 5/1994 | Allman et al. | 156/636 |
| 5,319,240 | 6/1994 | Faure et al. | 257/622 |

(List continued on next page.)

OTHER PUBLICATIONS

U.S. application No. 08/331,691, Chan et al., filed Oct. 31, 1994.
Docket No. 94–C–096, Kuei–wu Huang et al., filed Jun. 7, 1995.
Docket No. 95–C–079 T.C. Chan et al., filed Jun. 7, 1995.
"A four–Level–Metal Fully Planarized Interconnect Technology for Dense High Performance Logic and SRAM Application", Ronald R. Uttecht, et al., Jun. 11–12, 1991 VMIC Conference, pp. 20–26.
"Dual Damascene: A ULSI Wiring Technology", Carter W. Kaanta, et al., Jun. 11–12, 1991 VMIC Conference, pp. 144–152.

* cited by examiner

*Primary Examiner*—Sara Crane
(74) *Attorney, Agent, or Firm*—Theodore E. Galanthay; Lisa K. Jorgenson; Dan Venglarik

(57) ABSTRACT

A method is provided for forming planar multilevel metallization of a semiconductor integrated circuit, and an integrated circuit formed according to the same. Multilevel metallization is achieved through a planar process at each layer to allow for minimum widths of lines and vias and minimal lateral spacing between lines. Conductive lines and contacts are formed before planarization to further achieve good step coverage. A first metallization layer is formed by depositing aluminum over the integrated circuit, patterning and etching to form metal interconnect lines. Regions of planar insulating material are then formed between the metal lines. Another layer of aluminum is deposited and etched to form metal vias over selected portions of the metal lines. This layer of aluminum is patterned with a reverse pattern of that used to pattern the metal lines. Again, regions of planar insulating material are formed between the metal vias. The process of forming the aluminum lines and vias before planarization is free of voids, provides good step coverage and minimizes electromigration problems.

20 Claims, 5 Drawing Sheets

U.S. PATENT DOCUMENTS

| | | | |
|---|---|---|---|
| 5,321,211 | 6/1994 | Haslam et al. | 174/262 |
| 5,371,410 | 12/1994 | Chen et al. | 257/750 |
| 5,403,780 | 4/1995 | Jain et al. | 437/195 |
| 5,420,070 | 5/1995 | Matsuura et al. | 437/190 |
| 5,437,763 | 8/1995 | Huang | 216/18 |
| 5,468,997 * | 11/1995 | Imai et al. | 257/758 |
| 5,471,093 * | 11/1995 | Cheung | 257/758 |
| 5,485,038 * | 1/1996 | Licari et al. | 257/758 |
| 5,506,177 | 4/1996 | Kishimoto et al. | 437/195 |
| 5,534,462 | 7/1996 | Fiordalice et al. | 437/190 |
| 5,587,339 * | 12/1996 | Wyborn et al. | 437/195 |
| 5,675,186 * | 10/1997 | Shen et al. | 257/751 |

METHOD OF FORMING PLANARIZED MULTILEVEL METALLIZATION IN AN INTEGRATED CIRCUIT

FIELD OF THE INVENTION

The present invention relates generally to semiconductor integrated circuit processing, and more specifically to an improved method of forming planarized multilevel metallization techniques for integrated circuit manufacturing.

BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the photolithographic resolution available for the particular manufacturing facility. The goal of photolithography in establishing the horizontal dimensions of the various devices and circuits is to create a pattern which meets design requirements as well as to correctly align the circuit pattern on the surface of the wafer. As line widths shrink smaller and smaller in submicron photolithography, the process to print lines and contact holes in photoresist becomes increasingly more difficult.

With circuit advancement to the ultra-large-scale integration (ULSI) levels, more and more layers are added to the surface of the wafer. These additional layers in turn create more steps on the wafer surface. The resolution of small image sizes in photolithography thus becomes more difficult over the additional steps due to the increased problem of depth of focus. Planarization techniques become increasingly more important to offset the effects of a varied topography.

Planarization techniques may be applied to both dielectric layers and conductors or semiconductors. Planarizing regions of a wafer may be done in degrees from smoothing a particular layer to reduce the severity of steep slopes to global planarization across the entire wafer regardless of the underlying topography. Of course, global planarization is ideal but is also more difficult to achieve particularly between widely isolated features. The variations in the thickness of the material to be etched, differences in adjacent materials being etched and the underlying topography all add to the degree of difficulty of achieving global planarization.

Interconnect technology, creating connections between conducting regions, relies heavily on planarization techniques. In modern integrated circuits, the material of choice for upper-level conductive interconnection systems has been aluminum, including doped aluminum and aluminum alloys. Aluminum is an attractive material for integrated circuit metallization due to its high conductivity and low cost. The processing required to form aluminum metallization is also relatively easy, as it can readily be evaporated or sputtered onto the wafer. Aluminum is also able to form good ohmic contact to both p-type and n-type doped semiconductor material, such as silicon. In addition, aluminum is quite compatible with conventional semiconductor processes, such as that used to form bipolar and metal-oxide-semiconductor (MOS) devices, unlike other metals such as copper or gold which can diffuse into active regions and degrade device performance.

Certain drawbacks do exist for aluminum-based metallization systems, however, particularly as geometries enter the submicron regime. A well-known limitation of aluminum is its poor step coverage, particularly for vertical or retrograde sidewalls of contact openings through insulating layers such as silicon dioxide, and especially for sputtered aluminum, due to the shadowing effect of steep contact walls. In addition, mechanical stress in the aluminum film can cause voids therein. Stress-induced voids and step coverage faults of sufficient size can each cause an open in a metal line or contact. Furthermore, since aluminum metallization is subject to electromigration, and since the rate of electromigration increases with current density through the film, necking or narrowing of an aluminum line due to such voids or poor steps locally increases the current density. As a result, the electromigration rate increases at narrowed locations of the film, greatly increasing the electromigration failure rate.

A prior technique for addressing these limitations of aluminum metallization systems includes the use of refractory metal plugs, such as tungsten plugs, to fill contact openings in insulating layers. According to one example of this technique (for which many specific methods are well known in the art), after the opening of contacts through the insulating layer, a layer of tungsten is deposited by CVD over the wafer in such a manner as to conformally fill the contact opening, and is subsequently etched back to expose the surface of the insulating layer with the tungsten remaining in the contact opening. Alternatively, selective tungsten deposition has been used (the tungsten deposition on silicon but not on silicon dioxide) to fill contact openings. In either case, a subsequently deposited aluminum layer can readily make contact to the tungsten plug.

While the tungsten plug technique has many advantages, including good step coverage in all contacts, compatibility with planarized processing, and tolerance of misalignment in the etch of overlying aluminum lines (since the aluminum can be etched selectively relative to the tungsten), the tungsten plug process adds complexity to the manufacturing flow. In addition, deposited tungsten is vulnerable to poor adhesion and high contact resistance, requiring the use of additional sputtered barrier films prior to the deposited tungsten, and the associated added process complexity therewith.

As circuit density and device performance requirements increase, more complex wiring or routing of interconnects between conductors is required. Vertical as well as horizontal interconnects are required as the number of metallization layers increase to meet the requirements of more complex circuits. Current generation devices may require up to 5 to 6 layers of metallization to meet the wiring needs of state-of-the-art devices such as logic devices and SRAMs. To make such devices manufacturable within the limitations of existing equipment, planarization at each stage of processing becomes even more critical.

Accordingly, it is an object of the present invention to provide a method of forming planarized multilevel metallization regions to allow for complex routing of metal interconnections to achieve greater device density.

It is a further object of the present invention to form planarized regions containing metal interconnections and vertical metal pillars or vias between metal interconnections to support the multilevel metallization process.

It is yet a further object of the present invention to form planarized aluminum interconnections-and vias in submicron geometries with adequate step coverage absent of stress-induced voids and electromigration problems.

It is a further object of the present invention to provide such a method which utilizes standard processing techniques.

It is yet a further object of the present invention to provide such a method which allows for closer spacing of interconnect lines enabling more devices to be formed in a smaller chip area.

Other objects and advantages of the present invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. Multilevel metallization is achieved through a planar process to allow for minimum widths of aluminum lines and vias and minimal lateral spacing between the conductive regions. In addition, good step coverage is achieved with minimal voids and electromigration problems. A first aluminum layer is deposited over the integrated circuit. The first aluminum layer is patterned and etched to form an interconnect. A first planar insulating layer is formed over the aluminum interconnect to a depth greater than the height of the aluminum interconnect. The first insulating layer is etched, preferably by CMP, exposing at least a portion of the upper surface of the aluminum interconnect and providing a substantially planar surface across the entire wafer. A second aluminum layer is deposited over the integrated circuit. The second aluminum layer is patterned and etched to form a via overlying a selected region of the aluminum interconnect. A second planar insulating layer is formed over the aluminum via, exposed aluminum interconnect and first insulating layer to a depth greater than the height of the aluminum via. The second insulating layer is etched, preferably by CMP, exposing at least a portion of the upper surface of the aluminum via and providing a substantially planar surface across the entire wafer.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
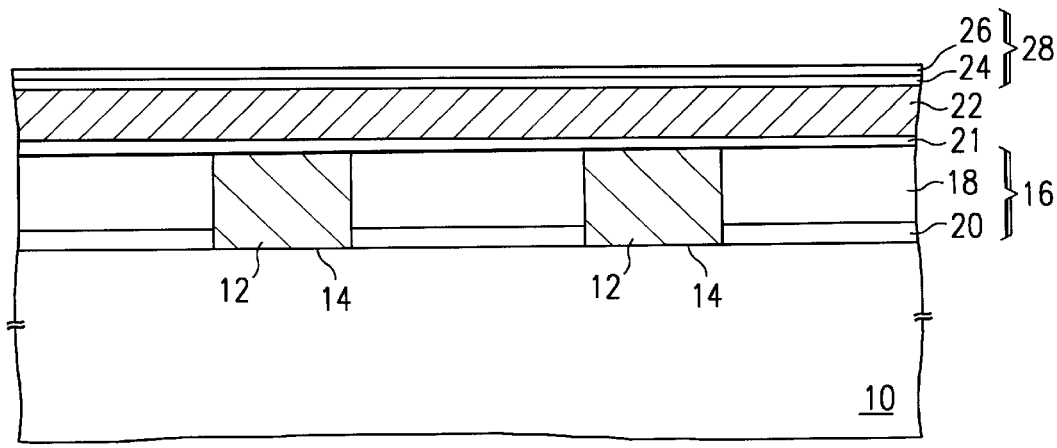
FIGS. 1 and 2A–2B are cross sectional views of the fabrication of a semiconductor integrated circuit according to one embodiment of the present invention.
Figure 2A:
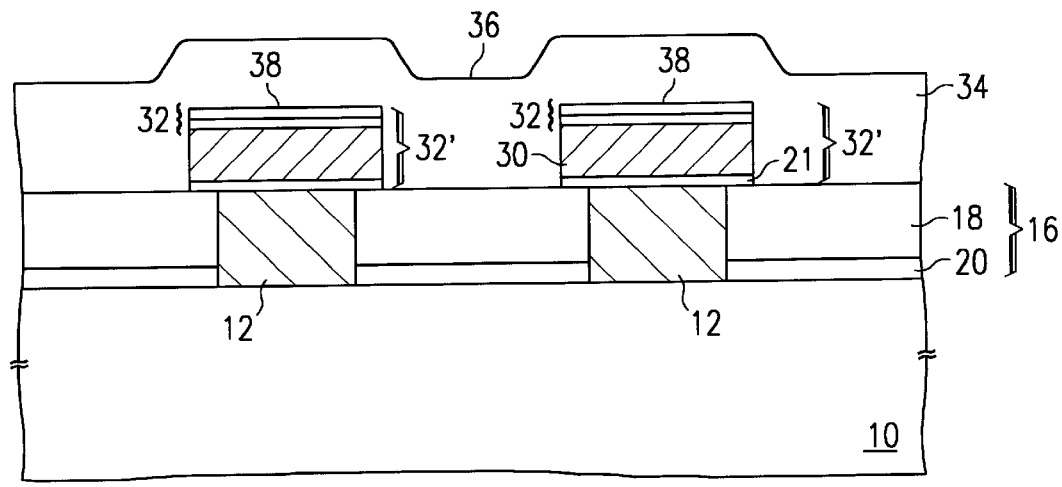
Figure 2B:
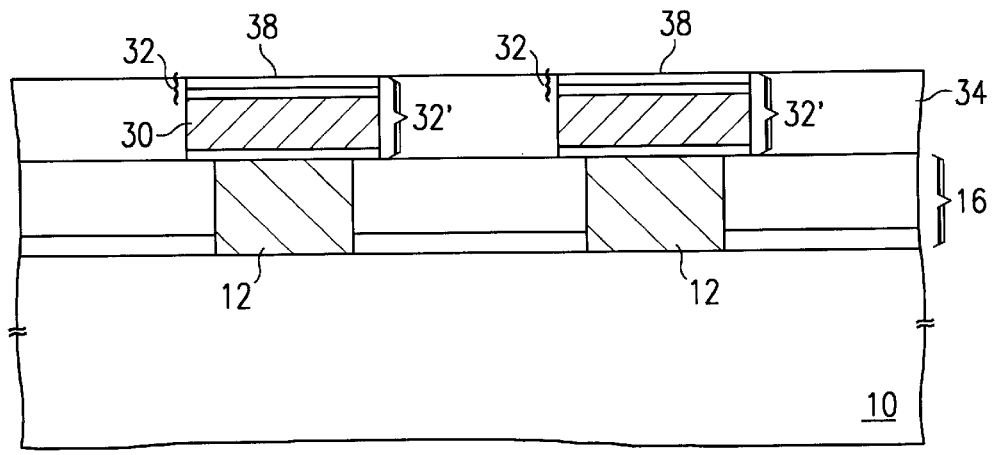

Referring now to FIGS. 1 and 2A–2B, a first embodiment of the present invention will be described which allows for a planarized integrated circuit to be formed. FIG. 1 illustrates, in cross-section, a partially formed integrated circuit structure at a surface of a wafer substrate 10. A conductive plug 12 is formed on an underlying region 14 in substrate 10. The conductive plug 12 may be formed by typical methods such as creating an opening in an insulating layer 16 and selectively depositing tungsten in the opening. Alternatively, the conductive plug 12 may be created by depositing aluminum over the insulating layer 16 and the opening, and then anisotropically etching back the aluminum. The purpose of the conductive plug 12 is to make electrical contact with a conductive element (not shown) in the underlying region 14 of substrate 10.

Insulating layer 16 may be any conventional insulator useful in modern integrated circuits, and is generally borophosphorous silicate glass (BPSG) either as a single layer or multiple layers. For example, the insulating layer may be a BPSG layer 18 overlying a thin dielectric layer 20 such as an undoped oxide. The BPSG helps to planarize the integrated circuit at this stage while the undoped oxide tends to heal the substrate surface from defects. Depending upon the particular process, insulating layer 16 may optionally be annealed to such a temperature that it reflows before or after the contact openings are formed but before the conductive plug 12 is formed, to improve metal step coverage of the conductive plug. The thickness of the insulating layer 16 may be on the order of 1.0 $\mu$m.

A glue layer 21, preferably a titanium or titanium/titanium nitride composite layer is formed over the tungsten plug and insulating layer 16. This glue layer is deposited to a thickness on the order of 300–600 angstroms and is formed to adhere a subsequently formed layer to the tungsten and to prevent a reaction between the tungsten plug and the overlying layer. A conductive layer 22, preferably an aluminum layer, is deposited over the glue layer to a thickness on the order of 4000 to 8000 angstroms. Aluminum layer 22 is preferably doped with silicon, copper, or both, or other conventional dopant material, as is well known in the art. In this example, the preferred aluminum alloy for aluminum layer 22 is Al-1% Si-0.5% Cu. Conductive aluminum layer 22 will be subsequently patterned and etched to form interconnects where needed for metal wiring such as over the conductive plugs 12. Before layer 22 is patterned, it is preferable to form an etch stop layer to prevent unwanted etching of the conductive layer 22 during subsequent processing steps. The etch stop layer may comprise a single layer 24 or multiple layers shown as 28 comprising layers 24 and 26. The etch stop layer 28 is formed of a different material than the underlying aluminum layer 22. If multiple layers are formed, layer 24 may be another glue layer to provide adhesion between the underlying aluminum and subsequently formed layers. Layer 24 may be a titanium layer or titanium/titanium nitride composite layer formed to a thickness on the order of 300–600 angstroms. In addition to the glue layer 24, a second layer 26 may be formed for better etch stop control, for example, layer 26 may be tungsten deposited by sputter deposition or chemical vapor deposition (CVD) formed to a thickness on the order of 500 to 1000 angstroms. Layer 28 may be any conductive material relative to which aluminum and aluminum alloys may be selectively etched.

Referring now to FIGS. 2A–2B, a first embodiment of the present invention will be described in detail. Referring to FIG. 2A, the conductive layer 22 as well as any optional glue layer 21 and glue/etch stop layer 28 are patterned and etched to form a conductive interconnect 30 and the optional glue/etch stop layer 32 as well as any glue layer 21. For ease of illustration, the conductive interconnects will be referred to as layer 32' to illustrate the conductive interconnect 30 with the optional glue/etch stop layers. A thick insulating layer 34 is formed over the conductive interconnects. Insulating layer 34 may be any suitable material, for example, an undoped oxide formed to a thickness on the order of 12,000 angstroms. If an undoped oxide material is used, it tends to be conformal, therefore, it is preferable in this embodiment to form the oxide to a depth wherein the lowermost portion 36 of oxide layer 34 lies above the uppermost portion 38 of the conductive interconnect 32'.

Referring to FIG. 2B, insulating layer 34 is etched back to expose the upper surface 38 of interconnect 32'. A preferred method of etching the insulating layer 34 is by way of chemical mechanical polishing (CMP) to planarize the surface of the integrated circuit before metal vias or other conductive regions are formed. CMP mechanically abrades the surface of the integrated circuit while applying a chemical constituent that attacks the whole surface simultaneously. Of course, other suitable methods of etching the insulating layer 34 may also be employed to achieve the desired wafer planarity.

By forming the aluminum interconnect before the surrounding insulating layer, there should be no step coverage problems or voids in the aluminum. This process should allow the aluminum lines to be formed with smaller widths and with smaller lateral distances between the lines. In addition, since there is no necking or narrowing of the aluminum line due to inadequate step coverage, there should be no increase in the current density, thus no increase in the electromigration failure rate. Since the lowermost portion 36 of the insulating layer 34 was above the uppermost surface 38 of the interconnect 32', when layer 34 is etched back, it will remain planar with the upper surface of the interconnect 32'.

Figure 3A:
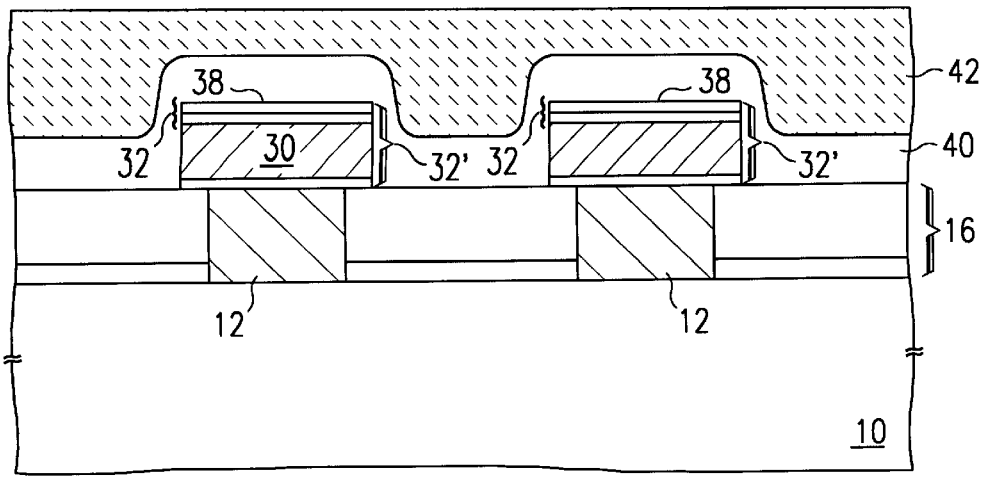
FIGS. 3A–3C and 5 are cross sectional views of the fabrication of a semiconductor integrated circuit according to an alternative embodiment of the present invention.
Figure 3B:
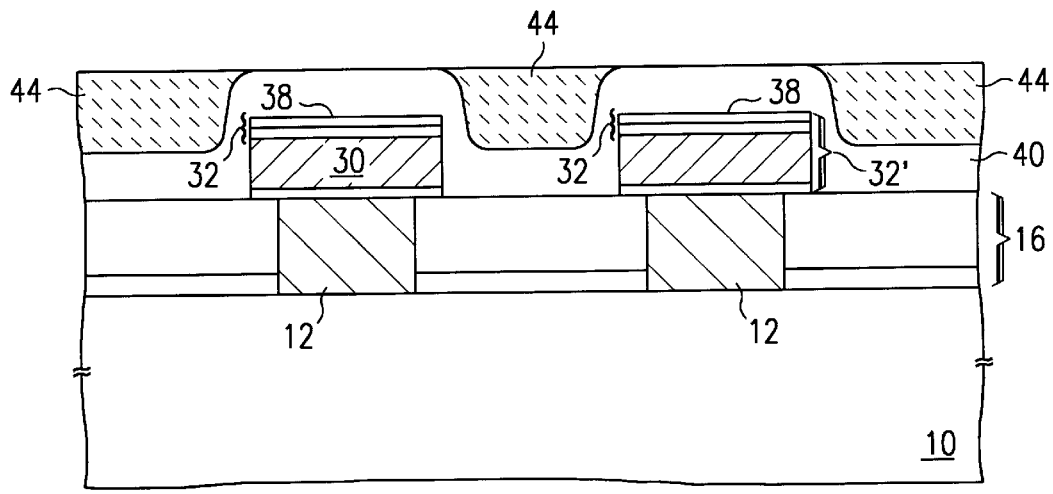
Figure 3C:
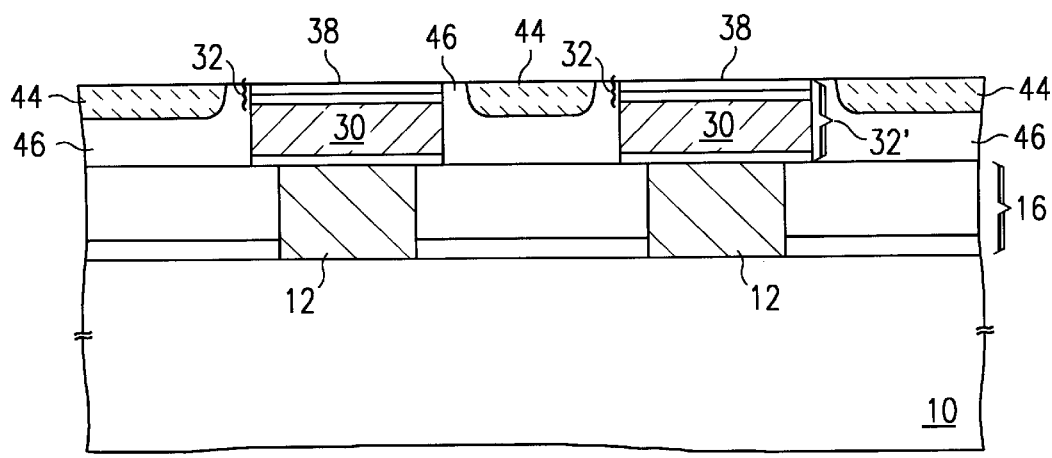

Referring now to FIGS. 3A–3C, an alternative embodiment will be described in detail. Where applicable, the same reference numerals will be used as for those regions of the integrated circuit described above. Referring to FIG. 3A, the aluminum interconnect 32' is patterned and etched as described above with reference to FIGS. 2A–2B. A conformal insulating layer 40, preferably an undoped oxide, is formed over the integrated circuit to a thickness on the order of 6000 angstroms. The conformal layer follows the contour of the underlying regions including the aluminum interconnects 32' and the insulating layer 16. In this embodiment, however, the conformal layer is thin enough such that the lowermost portion of the conformal layer lies below the uppermost portion of the interconnect 32'. As such, if the conformal layer is etched back at this stage to expose the upper surface 38 of the interconnects 32', a non-planar surface will result. To overcome this problem, before the conformal insulating layer 40 is etched, a thick planar sacrificial layer 42, preferably spin-on-glass or other suitable material, is formed over the conformal insulating layer to a thickness on the order of 6000 to 8000 angstroms.

Referring to FIG. 3B, the sacrificial layer 42 may be etched at this stage to expose the upper surface of the conformal insulating layer 40. This etch step results in pockets of sacrificial insulating material 44 which planarizes the conformal quality of the underlying insulating layer 40 above the surface 38 of the interconnects 32'.

Referring to FIG. 3C, both insulating layers 40, 42 are etched to expose the upper surface 38 of the interonnects 32' while maintaining a planar surface. The remaining pockets of insulating material 44, 46 now isolate the conductive interconnects 32' while maintaining the planarity of the structure to this point. The ratio of the etch rate of the sacrificial layer 42 to the etch rate of the conformal layer 40 may be important depending upon the etch chemistry. It is preferable to have a 1:1 etch ratio of the sacrificial layer to conformal layer to maximize the planarity of the resulting structure, even if CMP is used, which is the preferred etch process. For ease of illustration, the process steps shown with reference to FIGS. 4–6 will be described with reference to the formation of both the sacrificial layer and the conformal layer following from FIG. 3C. It will, of course, be appreciated by those skilled in the art that the following steps with reference to FIGS. 4–6 may be practiced with the thick insulating layer only which is formed with a lowermost region above the upper surface of the interconnets 32' as described above with reference to FIGS. 2A–2B.

Figure 4:
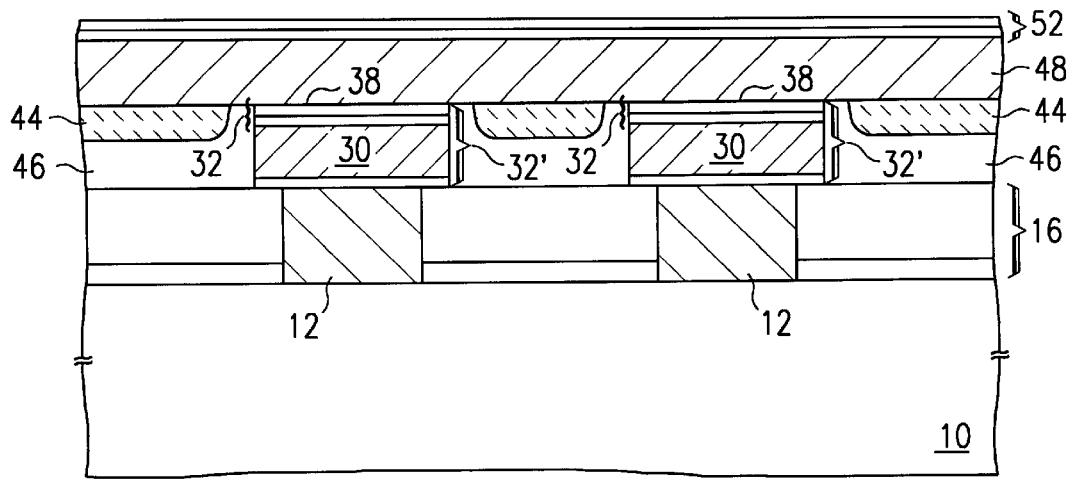

Referring now to FIG. 4, a planar surface containing vias overlying the interconnects will be formed. A conductive layer 48, again preferably an aluminum or aluminum alloy layer, is deposited over the integrated circuit to a thickness on the order of 4000 to 8000 angstroms. As described above with reference to the formation of the first conductive layer 22 (FIG. 1), aluminum layer 48 is preferably doped with silicon, copper, or both, or other conventional dopant material, as is well known in the art. Also as described above, it is preferable to form a glue/etch stop layer 52 to prevent unwanted etching of the conductive layer 48 at later processing steps. The etch stop layer may comprise a single layer or multiple layers formed to a thickness on the order of 300–1100 angstroms as described above.

Figure 5:
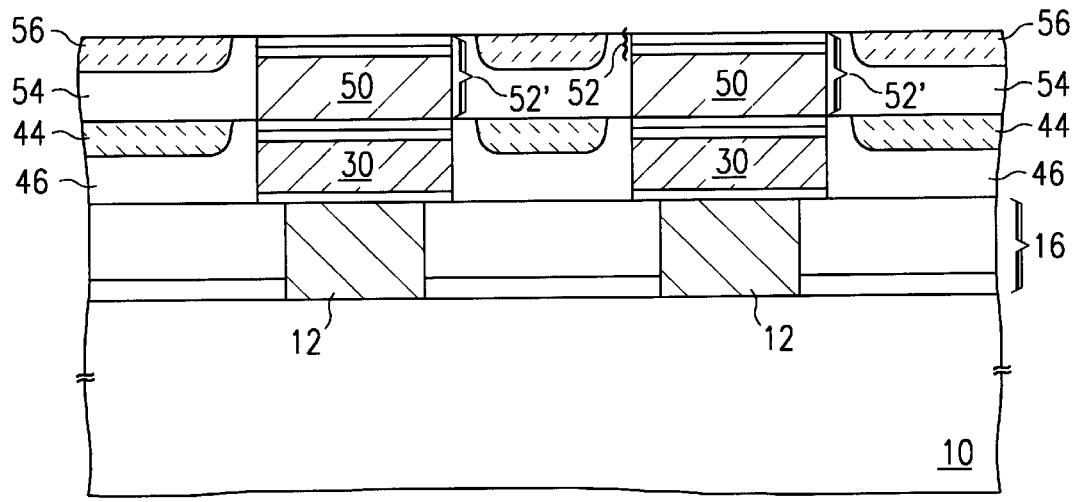

Referring to FIG. 5, aluminum via 50, along with the optional glue/etch stop layer 52 is patterned and etched to form vias 52'. The pattern used to form the aluminum vias 52' will partially be the reverse of a standard via pattern. As with the underlying aluminum interconnects 32', an insulating layer, again preferably an undoped oxide is formed over the integrated circuit. If the oxide layer is conformal wherein its lowermost region lies below the upper surface of the interconnect 52', a sacrificial layer is formed. If the sacrificial layer is formed, the etch back of the insulating layer, preferably by CMP results in dielectric pockets 54, 56 laterally isolating the aluminum vias 52'. As above, one skilled in the art will understand that this process may also use the thick insulating layer having its lowermost surface above the upper surface of the aluminum vias, thereby requiring only an etch back of the single insulating layer, again preferably by CMP.

Figure 6:
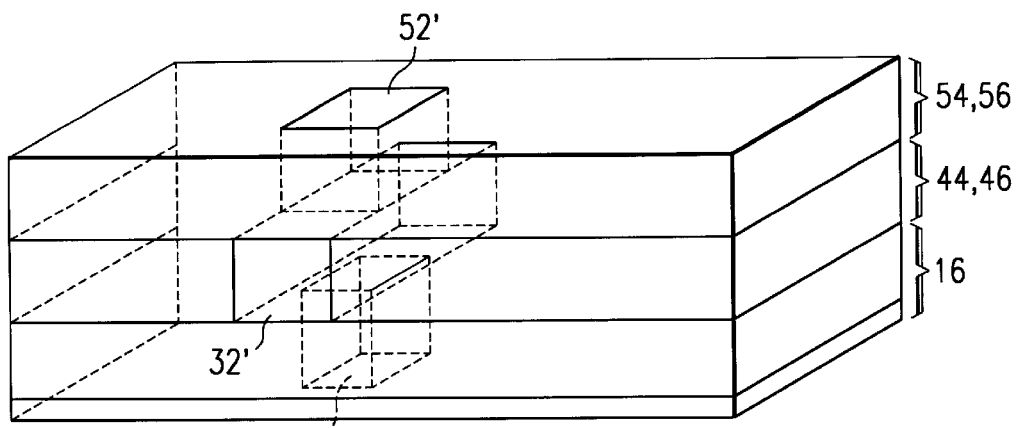
FIG. 6 is a three-dimensional view of the fabrication of a semiconductor integrated circuit according to one embodiment of the present invention.

Referring to FIG. 6, a three-dimensional drawing depicts the resulting structure showing the plug 12, aluminum interconnect 32' and aluminum via 52'. An advantage of the present invention is that by forming the interconnects and vias before planarization, the particular insulating layer and etch back method will provide a substantially planar surface with no step coverage problems. The etch stop layer will prevent any etching of the aluminum interconnect if the via is misaligned over the underlying dielectric and interconnect. This process may be repeated to achieve any desired level of interconnects and vias having substantially planar surfaces to facilitate subsequent processing steps.

Figure 7A:
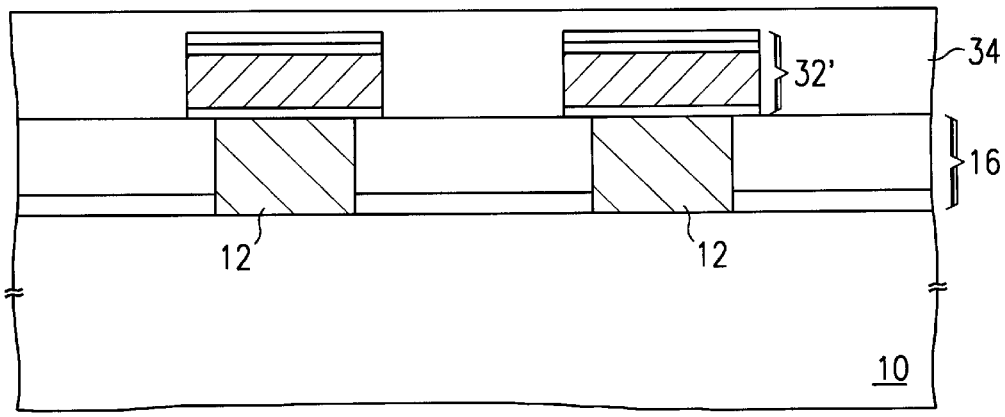
FIGS. 7A–7B, 8A–8B and 9 are cross sectional views of the fabrication of a semiconductor integrated circuit according to another alternative embodiment of the present invention.
Figure 7B:
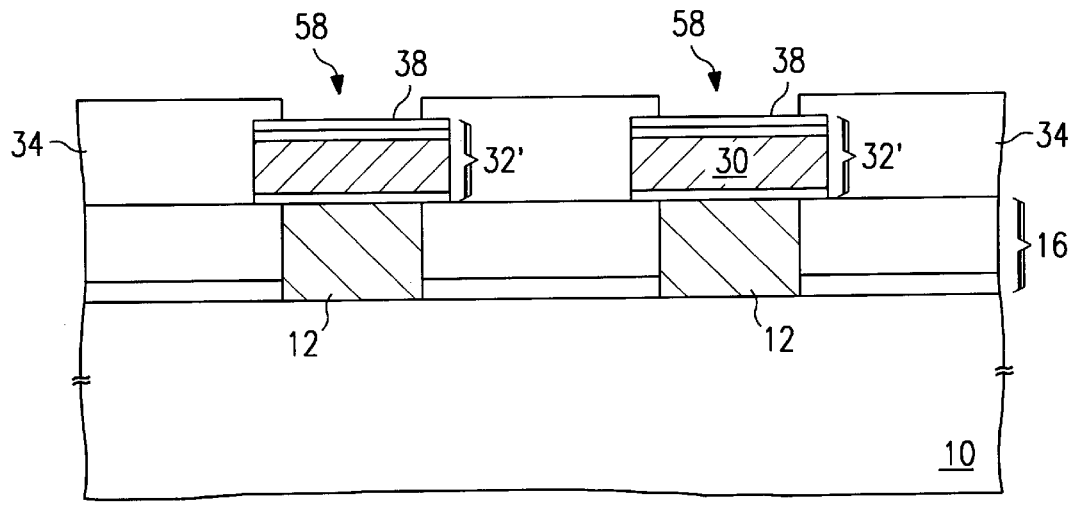

Referring to FIGS. 7A–7B and 8A–8B, alternative embodiments of the present invention will now be described. Where applicable, the same reference numerals will be used as for those regions of the integrated circuit described above. Referring to FIG. 7A, conductive plugs 12 and aluminum interconnects 32' which may include glue layer 21 (FIG. 2A) are formed as described above. Insulating layer 34 is formed over the integrated circuit wherein its lowermost surface lies above the upper surface of the interconnect 32'. In this embodiment, however, the insulating layer, preferably an undoped oxide, is etched back leaving a thin layer on the order of 1500 to 2000 angstroms above the interconnects 32'. Referring to FIG. 7B, an opening 58 is patterned and etched to expose a portion of the upper surface 38 of the interconnects 32'.

Figure 8A:
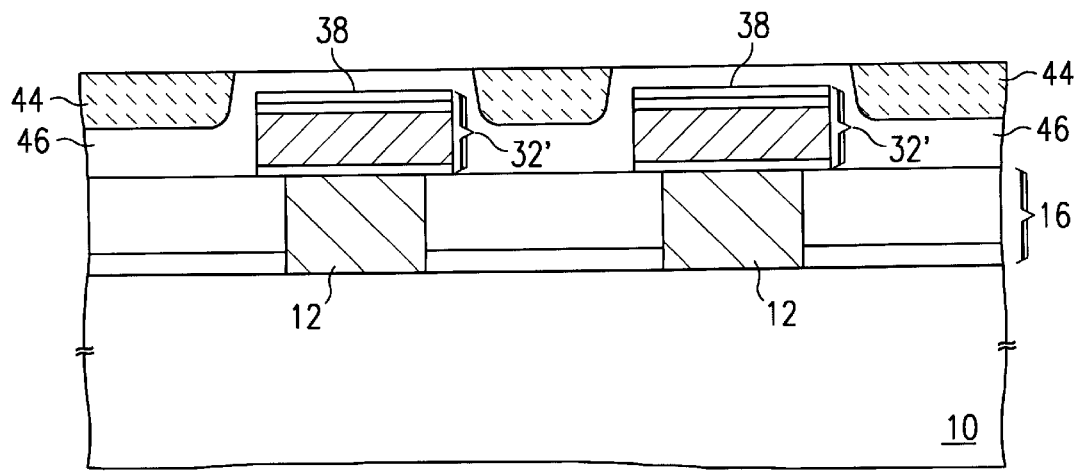
Figure 8B:
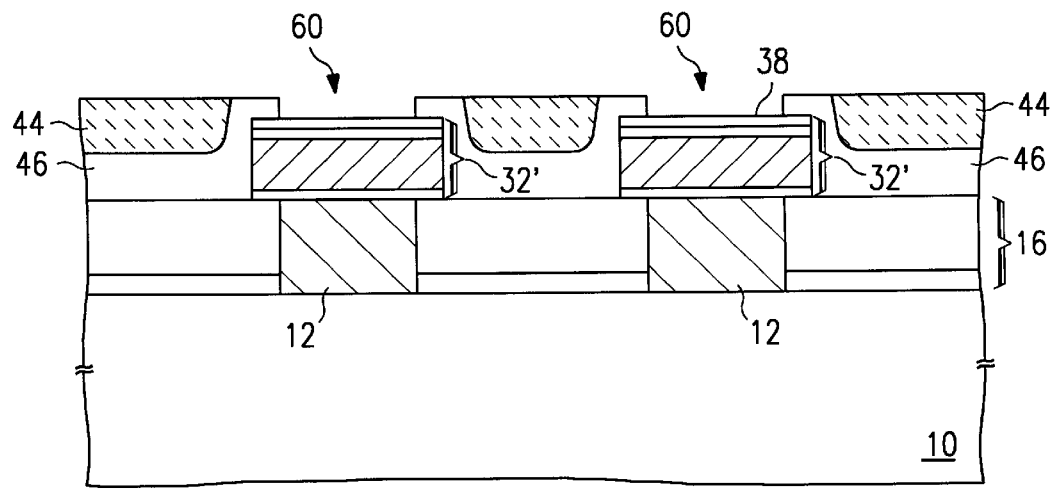

Alternatively, referring to FIG. 8A, the isolating dielectric pockets 44, 46 may be formed and etched back leaving a thin layer above the upper surface 38 of interconnects 32'. Referring to FIG. 8B, openings 60 are formed through the insulating layer 44, 46 to expose a portion of the upper surface 38 of interconnects 32'.

Figure 9:
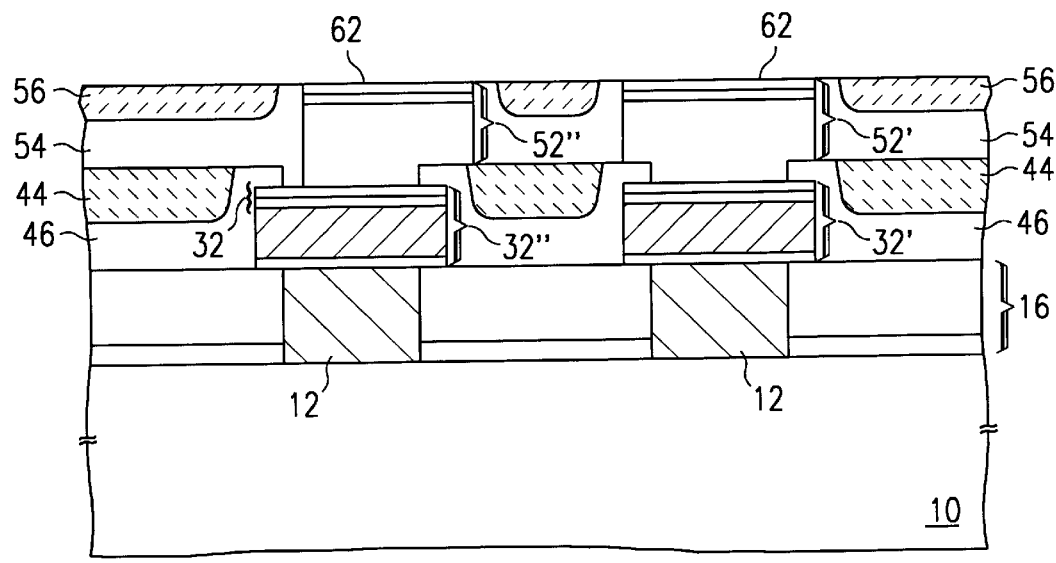

Referring to FIG. 9, vias 52' are formed over the interconnects 32' as described above. Insulating layers 54, 56 are formed and etched back. At this stage, the insulating layers 54, 56 may be etched back to the upper surface 62 of the vias 52' or may be etched back again leaving a thin layer above the upper surface of the vias. This process minimizes the effect of any misalignment of overlying conductive regions. However, it can be seen, for example by illustration, that with any misalignment such as via 52" over interconnect 32', the etch stop layer 32 will prevent any undesired etching of the aluminum interconnect 32'. Step coverage problems are also minimized since the insulating layer above the interconnects and vias is very thin.

Figure 10:
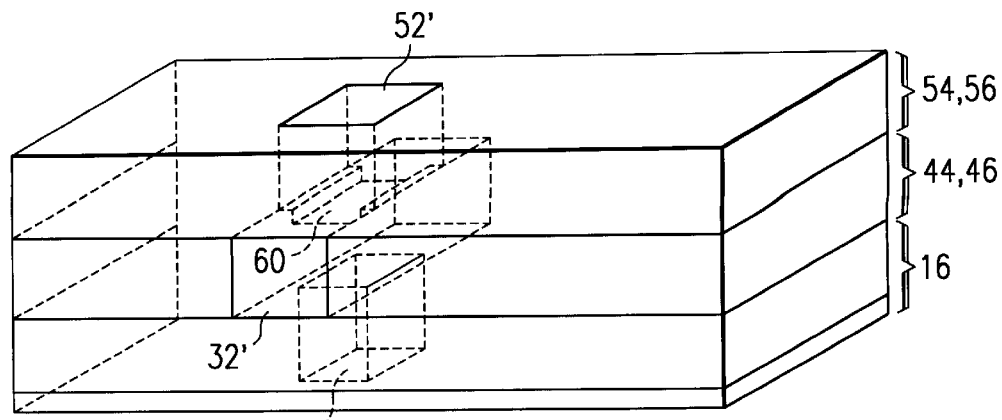
FIG. 10, is a three-dimensional view of the fabrication of a semiconductor integrated circuit according to an alternative embodiment of the present invention.

Referring to FIG. 10, a three-dimensional view of the alternative embodiment of the present invention is shown. It can be seen that the upper surface of the insulating layers 54, 56 lie above the surface of the interconnects 32' with opening 60 therein. Aluminum via 52' is formed over the interconnect 32' and in the opening 60. Again, if the glue/etch layer is formed, any misalignment of the via 52' over the interconnect 32' will not cause the aluminum interconnect 32' to be etched away. This structure and process for making it provides for a substantially planar integrated circuit at each stage of manufacturing while at the same time providing adequate step coverage and filling of the interconnect and via areas from level to level.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A planarized multilevel metallization region of an integrated circuit, comprising:
    a substrate having a plurality of active regions at a first surface of the substrate;
    a dielectric layer disposed over a portion of the substrate and having an opening therethrough exposing a portion of at least one of the plurality of active regions;
    a conductive plug in the opening in the dielectric layer disposed over the exposed portion of the active region;
    a plurality of planar interconnect lines; the interconnect lines comprising:
        a first glue layer;
        an aluminum conductive line overlying the first glue layer;
        a second glue layer disposed over the aluminum conductive line;
        a first etch stop layer disposed over the second glue layer; wherein at least one of the plurality of interconnect lines is disposed over the conductive plug;
    a plurality of first planar insulating regions disposed between the interconnect lines;
    a plurality of planar conductive pillars disposed over selected portions of the interconnect lines; the pillars comprising:
        an aluminum layer;
        a third glue layer disposed over the aluminum layer;
        a second etch stop layer disposed over the third glue layer;
    a plurality of second planar insulating regions disposed between the conductive pillars.

2. The structure of claim 1, wherein the conductive plug comprises tungsten.

3. The structure of claim 1, wherein the interconnect lines comprise an aluminum alloy.

4. The structure of claim 1, wherein the conductive plugs comprises an aluminum alloy.

5. The structure of claim 1, wherein the first, second and third glue layers comprise a refractory metal.

6. The structure of claim 5, wherein the refractory metal comprises titanium.

7. The structure of claim 1, wherein the first, second and third glue layers have a depth between approximately 300 and 600 angstroms.

8. The structure of claim 1, wherein the first and second etch stop layers comprise a refractory metal.

9. The structure of claim 8, wherein the refractory metal comprises tungsten.

10. The structure of claim 8, wherein the refractory metal comprises titanium.

11. The structure of claim 1, wherein the first and second etch stop layers have a depth between approximately 500 and 1000 angstroms.

12. The structure of claim 1, wherein the first planar insulating regions comprise oxide.

13. The structure of claim 1, wherein the first planar insulating region comprises a planar dielectric layer having an upper surface and a plurality of pockets of sacrificial insulating material dispersed along the upper surface of the planar dielectric layer.

14. The structure of claim 13, wherein the sacrificial insulating material comprises spin-on-glass.

15. The structure of claim 1, wherein the interconnect lines have a depth between approximately 4000 and 8000 angstroms.

16. The structure of claim 1, wherein the conductive pillars have a depth of between approximately 4000 and 8000 angstroms.

17. The structure of claim 1, wherein the plurality of planar insulating regions have an upper surface planar with an upper surface of the planar interconnect lines.

18. The structure of claim 1, wherein the plurality of planar insulating regions have an upper surface above an upper surface of the planar interconnect lines.

19. A planarized multilevel metallization region of an integrated circuit, comprising:
    a substrate having a plurality of active regions at a first surface of the substrate;

a dielectric layer disposed over a portion of the substrate having an opening therethrough exposing a portion of at least one of the plurality of active regions;

a conductive plug in the opening in the dielectric layer disposed over the exposed portion of the active region;

a plurality of planar interconnect lines; the interconnect lines comprising:
aluminum conductive lines;
a first glue layer disposed under the aluminum conductive lines;
a second glue layer disposed over the aluminum conductive lines;
a first etch stop layer disposed over the second glue layer; wherein at least one of the plurality of interconnect lines is disposed over the tungsten plug;

a plurality of first insulating regions disposed between the interconnect lines and disposed over the dielectric layer and a portion of the interconnect lines exposing an upper surface of a portion of the interconnect lines;

a plurality of planar conductive pillars disposed over selected portions of the interconnect lines; the pillars comprising:
an aluminum layer;
a third glue layer disposed over the aluminum layer;
a second etch stop layer disposed over the third glue layer;

a plurality of second planar insulating regions disposed between the conductive pillars and disposed over the first insulating regions and the exposed portions of the interconnect lines.

20. The structure of claim 19, wherein a first portion of a lower surface of the conductive pillars is disposed substantially over the interconnect lines and a second portion of the lower surface of the conductive pillars is disposed over the first insulating layer.

* * * * *